United States Patent [19]

Ports

[11] 4,288,911
[45] Sep. 15, 1981

[54] METHOD FOR QUALIFYING BIASED INTEGRATED CIRCUITS ON A WAFER LEVEL

[75] Inventor: Kenneth A. Ports, Indialantic, Fla.

[73] Assignee: Harris Corporation, Melbourne, Fla.

[21] Appl. No.: 106,127

[22] Filed: Dec. 21, 1979

[51] Int. Cl.³ .................... H01L 21/66; H01L 21/423
[52] U.S. Cl. ........................................ 29/574; 29/583;
29/591; 250/492 A; 324/158 T
[58] Field of Search ................ 29/574, 583, 584, 591;
324/158 R, 158 T; 250/492 A

[56] References Cited

U.S. PATENT DOCUMENTS

| | | | |
|---|---|---|---|
| 3,461,547 | 8/1969 | Di Curcio | 29/574 |
| 3,553,830 | 1/1971 | Jenny et al. | 29/574 |
| 3,723,873 | 3/1973 | Witteles | 324/158 T |
| 3,769,693 | 11/1973 | Cates et al. | 29/574 |
| 3,849,872 | 11/1974 | Hubacher | 29/574 |
| 4,032,949 | 6/1977 | Bierig | 357/51 |
| 4,172,228 | 10/1979 | Gauthier et al. | 250/492 A |
| 4,220,918 | 9/1980 | Pepper | 324/158 T |

FOREIGN PATENT DOCUMENTS 54-102976  8/1979  Japan ...................................... 29/574

*Primary Examiner*—Aaron Weisstuch
*Attorney, Agent, or Firm*—Leitner, Palan, Martin & Bernstein

[57] ABSTRACT

Integrated circuits in dice on a wafer are qualified by providing two sets of conductors connected to each die by fusible elements, biasing the dice using said conductors during exposure to a qualifying environment, testing the fusible elements, removing the conductors and testing the circuits. Where the environment is gamma radiation, the fusible elements are tested before annealing of radiation damage and the circuits are tested before and after annealing.

23 Claims, 2 Drawing Figures

U.S. Patent  Sep. 15, 1981  4,288,911
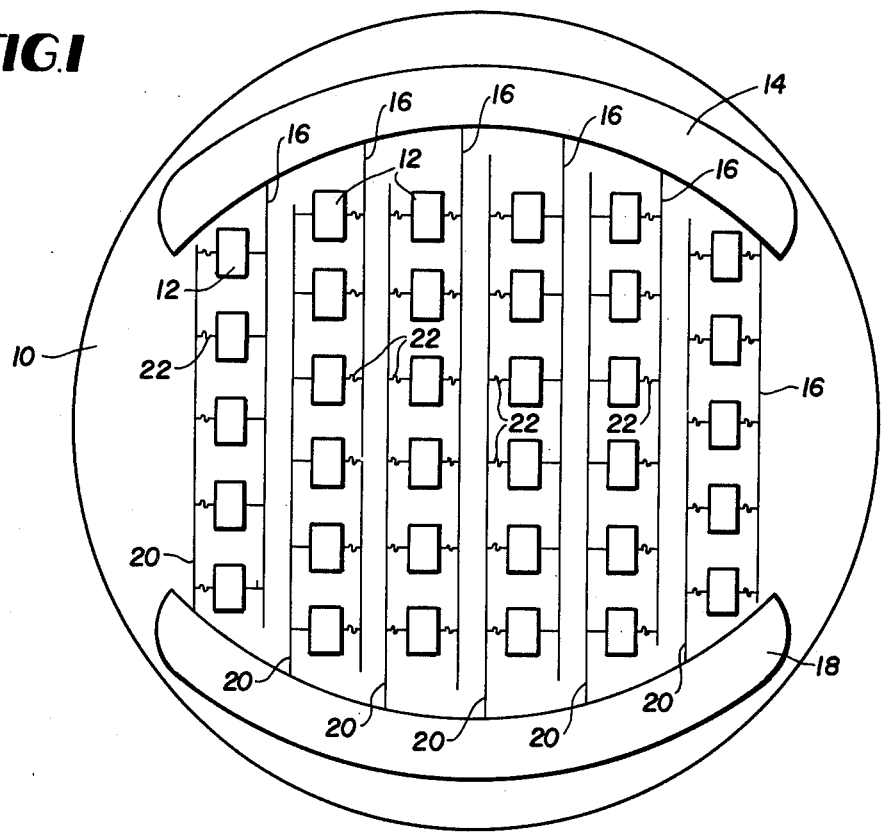
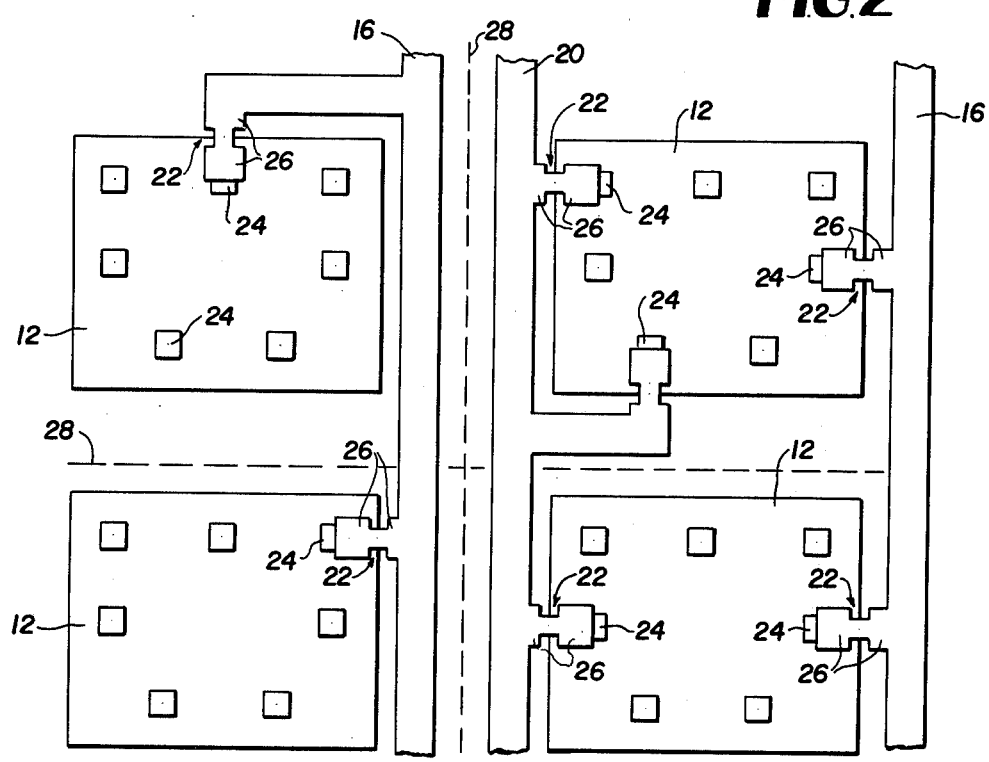

METHOD FOR QUALIFYING BIASED INTEGRATED CIRCUITS ON A WAFER LEVEL

BACKGROUND OF THE INVENTION

The present invention relates generally to qualifying integrated circuits and more particularly to a method of qualifying biased integrated circuits on a wafer level.

Many qualification tests for integrated circuits are performed on the die level once the die is mounted into a package. The packaged die is subjected to a qualifying environment and then tested. Because of the different types of housing, the temperature of the qualifying environment may be limited. Similarly, based on the number of dice from a lot which do not qualify, the decision to scrap, retest, or otherwise treat the total lot is made. Thus, if the dice can be tested at the wafer level, the expense of packaging an unacceptable lot is eliminated.

Many of the qualifying tests for environments performed at the die level require biasing of the die while being subject to qualifying environment. Two such tests are the biased burn-in qualification and the radiation hard qualification for gamma ray radiation.

Generally for biased burn-in qualification, the individual dice, after being packaged, go through an initial testing of electrical characteristics. After the initial tests of the packaged unit, they are sent to a biased, high temperature burn-in for approximately 168 hours and then returned for testing of their electrical characteristics. Based on the type of failures occuring after the burn-in, all the dice from a given run are shelved for product engineering and failure analysis or subjected to a recycle of biased burn-in. Ultimately based on the failure rate, the whole run may be scrapped based on the failure of a few parts, generally greater than five percent. If the biased burned-in testing procedures are conducted at the wafer level, the expense of packaging and re-burn-in are eliminated and an earlier decision on scrapping the run at the wafer level can be made.

Generally, integrated circuits are radiation qualified by irradiating the package device, testing it and then annealing to remove the radiation damage. To perform such qualification of integrated circuits on an individual or die basis, is generally expensive. Similarly, because of temperature limitation of the package, the anneal temperature to remove radiation damage is limited. In order to reduce the expense of packaging nonradiation hard circuits, it has been suggested to test the dice and the circuits on a wafer level. U.S. Pat. No. 3,769,693 specifically discusses neutron irradiation and testing on the wafer level with subsequent breaking of the wafer into individual individual die and annealing the individual dice. Although addressing neutron radiation, this patent does not discuss a test procedure for total dose gamma ray radiation.

Since the low-dose-rate gamma ray damage takes the form of excessive positive charge generated and ultimately trapped in the circuit passivating dielectric, the nature of the electric fields within the dielectric determine the behavior of the positive charges as they are generated and the net electrical effect of the irradiation upon the circuit. Thus, to properly qualify the circuitry for gamma ray radiation, the integrated circuits must be biased during gamma ray irradiation. This requires a different test procedure than that described in U.S. Pat. No. 3,769,693 for neutron irradiation.

SUMMARY OF THE INVENTION

An object of the present invention is to provide a method of preparing the dice on a substrate for biased test qualification at the wafer level.

Still a further object of the present invention is to provide a process for qualifying radiation hard integrated circuits for total dose gamma ray irradiation.

Even another object of the present invention is to provide an economical testing procedure for integrated circuits to total dose gamma ray irradiation at the wafer level.

A further object of the invention is to provide protection of integrated circuits from shorted integrated circuits during the biasing required for a given environmental qualification.

As even further object of the present invention is to provide means for biasing the plurality of integrated circuits on a wafer which is compatible with the integrated circuit fabrication process and which diminishes minimally the surface area available for integrated circuits.

Still another object is to provide a test procedure for irradiated circuits which assures eradication of radiation damage.

These and other objects of the invention are attained by forming two sets of conductors on the wafer over the scribe line connected to each die. At least one fusible element connects each die to at least one set of conductors. Each of the dice are biased by a voltage applied to a pair of terminals for the two sets of conductors and the wafer is subjected to a qualifying environment during the biasing period. Subsequent to the exposure to the qualifying environments, the fusible elements are tested to determine if they were either initially defective or if they had been blown during biasing, and the disconnected dice are marked. Prior to the circuit testing, the sets of conductors are removed from the wafer as well as the underlying insulative layer to expose the areas in which the wafer is to be scribed. The circuits are then individually tested and marked. The scribed wafer is broken into a plurality of dice and the unmarked dice or qualified integrated circuits are separated from the marked or disqualified dice. The qualified integrated circuits are then assembled into appropriate housings.

Where the qualifying environment is gamma ray radiation, the wafer is irradiated with gamma ray radiation during the biasing period; this is followed by a high temperature anneal to remove the irradiation damage. The set of conductors may be removed before the annealing and an additional circuit test performed before the annealing as well as after the annealing.

BRIEF DESCRIPTION OF THE DRAWINGS

FIG. 1 is a diagrammatic top view of an integrated circuit wafer incorporating the principles of the present invention.

FIG. 2 is an enlarged, detailed, fragmentary top structure of a portion of FIG. 1.

DESCRIPTION OF THE PREFERRED EMBODIMENTS

FIG. 1 shows an integrated circuit wafer 10 having a plurality of integrated circuit dice 12 thereon. In addition to the metallization on the integrated circuit die, the present invention includes two sets of conductors having two distinct terminals or electrodes. The first set of conductors includes a terminal or electrode 14 and a plurality of substantial parallel conductors 16 extending therefrom. The second set of conductors includes a terminal or electrode 18 having a plurality of substantially parallel conductors 20 extending therefrom. The integrated circuits on the dice 12 are each connected to each of the conductor systems 16 and 20. The interconnection of at least one of the conductors to the integrated circuit of each die is through a fusible element 22. As illustrated in FIG. 1, the integrated circuit dice may be connected by a single fusible element 22 extending from conductor 20 as in column one or from the conductor 16 as in column two. Similarly as illustrated in column three, the conductors 16 and 20 may both be connected to the individual integrated circuit dice by fusible elements 22. Since sets of conductors are biased during environmental qualification, the fusible element will blow and disconnect all integrated circuit dice which have a short therein. This will prevent the other commonly connected dice also from being improperly biased during the environmental qualification. Since the dice are connected and biased between conductors 16 and 20, only one fuse is needed, though connecting each of the conductors to the dice through a fuse is preferred.

As illustrated more explicitly in enlarged view of FIG. 2, each of the integrated circuit dice includes contact pads 24 therein. The fuse 22 is an extension of the conductors 16 and 20, which have enlarged probe pads 26 at each end of the fusible element. This will be important during the described method of the present invention. It should also be noted that the conductors 16 and 20 are formed in the region between the dice of 12 in which the wafer will be scribed and broken into individual dice. The scribe lines are illustrated in phantom as dotted line 28.

The test procedure begins by applying a voltage across terminals 14 and 18 to bias all the dice 12 on the wafer 10. While dice are biased, the wafer is subjected to the qualifying environment for the appropriate time. After the exposure, the individual fusible elements 22 are tested or probed using probe pads 26. The dice having the defective fusible elements which were initially defective or blown during the biasing period are marked with a dot of ink. This is followed by the removal of conductors 16 and 20. The individual circuits of the dice 12 are then tested, and those which fail to meet preselected performance characteristics are marked with a dot of ink. The removal of the common conductors 16 and 20 prevent any electrical interconnection of the integrated circuits of the individual dice during the circuit testing of another die. The wafer is then scribed along lines 28 and broken into individual dice. The uninked dice are then segregated from the inked dice and assembled into appropriate housings.

The test procedure for gamma radiation qualification begins with probing or testing the individual fusible elements 22 using probe pads 26. The dice having the defective fusible elements are marked with a dot of ink to indicate that the die that would not bias during the irradiation sequence. A voltage is then applied across terminals 14 and 18 to bias all of the dice 12 in the wafer 10. While the dice are biased, the wafer is subjected to gamma ray irradiation. Depending upon the devices which comprise the integrated circuits, the radiation level is between $10^4$ to $10^6$ rads. After irradiation, the conductors 16 and 20 are removed and the individual circuits of the dice 12 are tested. The circuits of the dice which failed to meet preselected performance characteristics, are marked with ink.

It should be noted that defectively formed circuits may short out during the biasing and consequently blow their respective fusible elements 22. Before the removal of the conductor 16 and 20, a retest of the fusible elements 22 may be performed to further identify circuits which are defective due to electrical shorts. Generally these circuits will not pass the circuit test and thus this additional test of the fusible elements may be considered unnecessary.

After the circuit test and marking, the wafer is then annealed at sufficiently high temperatures for sufficient period of time to remove any damage produced by the radiation. For the irradiation levels previously described, annealing at 300° C. for approximately twenty minutes is an example of annealing process. Although it is preferred that the dice be annealed at the wafer level so as to allow annealing at high temperatures to assure removal of all radiation damage, for certain applications, the dice may be self annealed when mounted in a package due to the high temperatures occurring during sealing of the package. This alternative is suggested, but not preferred.

After the annealing sequence, the integrated circuits of the individual dice are again tested and defective circuits are marked with ink. The wafer is then scribed along lines 28 and broken into individual dice. The uninked dice are then segregated from the inked dice and assembled in appropriate housings or circuits. It should be noted that because of the high annealing temperature which may be used care should be taken in the selection of the marking ink such that it does not evaporate during the annealing process at the wafer level.

To form the conductor system of the present invention which is required so as to perform the environmental qualification or testing of circuits while being biased, very little additional processing or materials are needed. After the wafer has completed standard processing to form the devices of the integrated circuits, the contact aperture mask, modified so as not to include the scribe lines and contact apertures beneath the to-be-formed terminals 14 and 18, is used to form the contact apertures in the insulative layer over the wafer. A metallic layer is then provided over the wafer and delineated to form the electrodes 14 and 18, conductors 16 and 20 and fusible elements 22. The fusible elements 22 are formed from the same material, for example, aluminum, which forms the conductor systems as well as the conductors and innerconnects on the integrated circuits on the individual dice 12. A separate mask is used to remove the conductors 16 and 20 and the insulative layer to expose the areas which will be scribed to facilitate breaking of the wafer into the plurality of dice. Since the conductors are to be removed after the exposure to the qualifying environment, the same mask is used to also remove the insulative layer from the areas of the wafer between the dice which are to be scribed. Thus forming the conductors 16 and 20 over the scribe line area reduces the number of mask and masking steps and requires dedication of no additional wafer surface area. Thus, the present process merely requires modifying the aperture mask to remove the scribe lines and eliminate the contact apertures below the terminals 14 and 18, adding the conductors, terminals and fusible elements to the metallization mask and making a separate scribe line mask. Since the masking information is readily available, no additional expense is needed to derive the additional information for the mask for the present process. Similarly, the process only includes one additional sequence to remove the conductors and expose the scribe areas and consequently will not increase the expense of producing a wafer which is capable of qualifying to be radiation hard for gamma ray radiation.

From the preceding description of the preferred embodiment, it is evident that the objects of the invention are attained in that a plurality of biased integrated circuits can be qualified at the wafer level. Although the invention has been described and illustrated in detail it is to be clearly understood that the same is by way of illustration and example only and is not to be taken by way of limitation. Other types of tests may be performed which would require biasing, for example biased burn-in, and thus the specially prepared wafer and method described would be equally applicable to these types of tests also. The spirit and scope of this invention are to be limited only by the terms of the appended claims.

What is claimed:

1. A method for qualifying radiation hard integrated circuits at the wafer level comprising:
   electrically interconnecting the dice containing said integrated circuits on the wafer electrically;
   electrically biasing the dice on said wafer;
   irradiating the wafer with gamma ray radiation while said dice are electrically biased;
   annealing said dice sufficiently to remove radiation damage; and
   testing the circuitry on said dice.

2. The method according to claim 1 including testing the electrical interconnects before irradiating and marking defectively connected dice.

3. The method according to claim 2 including testing the circuitry on said dice after irradiating and before annealing and marking defective dice.

4. The method according to claim 1 wherein said dice are interconnected to common conductors by fusible elements; and
   including testing the condition of the fusible elements before irradiating and marking disconnected dice.

5. The method according to claim 4 wherein said interconnecting includes forming contact apertures in an insulative layer of the wafer, forming conductors on said insulative layer, and interconnecting said conductors and said dice with said fusible elements via said apertures.

6. The method according to claim 5 including removing said conductors and the underlying insulative layer to expose scribe areas of the wafer and breaking said wafer into separate dice after annealing.

7. The method according to claim 4 wherein said conductors are formed connected to one of two electrodes and the conductors are selectively connected to said dice whereby all dice can be simultaneously electrically biased during said irradiating.

8. The method according to claim 1 wherein said electrically interconnecting includes forming a first plurality of conductors on said wafer connected to a first electrode and a second plurality of conductors connected to a second electrode, and each die is connected to at least one conductor of each of said first and second plurality of conductors.

9. The method according to claim 1 including removing said electrical interconnectors after said irradiating and before testing the circuitry on said dice.

10. A method for qualifying radiation hard integrated circuits at the wafer level comprising:
    forming a first and second electrode each having a plurality of conductors on said wafer, each die on said wafer containing an integrated circuit being connected to a conductor of both of said electrodes;
    electrically biasing said first and second electrodes;
    irradiating the wafer with gamma ray radiation while said dice are electrically biased;
    removing said conductors;
    testing the circuitry on said dice and marking defective dice; and
    annealing said dice sufficiently to remove radiation damage.

11. The method according to claim 10 wherein said conductors are connected to said dice by fusible elements; and including testing the condition of the fusible elements before irradiating and marking disconnected dice.

12. The method according to claim 10 including testing the circuitry on said dice and marking defective dice after annealing, and subsequently breaking said wafer into a plurality of separate dice.

13. A method for qualifying radiation hard integrated circuits at the wafer level comprising;
    forming a first and a second discrete conductor on said wafer, each connected to each die containing an integrated circuit on said wafer, at least one of said conductors being connected to each die by a fusible element;
    electrically biasing said conductors;
    irradiating the wafer while said dice are electrically biased;
    annealing said dice sufficiently to remove radiation damage; and
    testing the circuitry on said dice.

14. The method according to claim 13 including testing said fusible elements and marking disconnected dice.

15. The method according to claim 14 wherein said fusible elements are tested before said irradiating.

16. The method according to claim 15 wherein said fusible elements are tested after said irradiating.

17. The method according to claim 13 including testing said circuitry on said dice after radiation and before annealing.

18. The method according to claim 17 including removing said conductors after irradiating and before testing and annealing.

19. A method for qualifying integrated circuits at the wafer level comprising:
    forming a first and a second discrete conductor on said wafer, each connected to each die containing an integrated circuit on said wafer, at least one of said conductors being connected to each die by a fusible element;
    electrically biasing said conductors;
    subjecting said wafer to the qualifying environment while said dice are electrically biased;
    testing the condition of said fusible elements and marking disconnected dice; and
    testing the circuitry on said dice and marking defective dice.

20. A method according to claim 19 wherein the fusible elements are tested before being electrically biased and disconnected dice are marked.

21. A method according to claim 19 including removing said conductors after testing for disconnected fusible elements and before circuit testing.

22. A method according to claim 21 including removing the conductors along with the underlying insulative layer to expose scribe areas of the wafer and breaking said wafer into dice after the circuit testing and marking.

23. A method according to claim 19 wherein forming said first and second discrete conductors includes forming contact apertures in an insulative layer of said wafer to all contact points of the circuits on said dice except for the area over which an electrode of a respective conductor will be formed, and applying a conductive layer to said wafer and patterning said conductive layer to form said conductors, electrodes and fusible elements.

* * * * *